United States Patent [19]
Yamakawa et al.

[11] Patent Number: 5,214,005
[45] Date of Patent: May 25, 1993

[54] GLASS-ALUMINUM NITRIDE COMPOSITE MATERIAL

[75] Inventors: Akira Yamakawa; Koichi Sogabe, both of Itami, Japan

[73] Assignee: Sumitomo Electric Industries, Ltd., Japan

[21] Appl. No.: 820,550

[22] Filed: Jan. 14, 1992

[30] Foreign Application Priority Data

Feb. 4, 1991 [JP] Japan .................................. 3-033345

[51] Int. Cl.$^5$ ...................... C03C 14/00; C04B 35/58
[52] U.S. Cl. ......................................... 501/32; 501/96
[58] Field of Search ...................... 501/15, 17, 32, 96

[56] References Cited

U.S. PATENT DOCUMENTS

| | | | |
|---|---|---|---|
| 3,645,839 | 2/1972 | Veres | 501/15 |
| 4,455,384 | 6/1984 | Day et al. | 501/46 |
| 4,882,212 | 11/1989 | SinghDeo et al. | 501/32 |
| 4,985,176 | 1/1991 | Watanabe | 501/32 |
| 5,017,434 | 5/1991 | Enloe et al. | 428/428 |

FOREIGN PATENT DOCUMENTS

| | | | |
|---|---|---|---|
| 63-210043 | 8/1988 | Japan . | |
| 63-222043 | 9/1988 | Japan . | |
| 2-196073 | 8/1990 | Japan . | |
| 2-221162 | 9/1990 | Japan . | |
| 739035 | 6/1980 | U.S.S.R. | 501/32 |

*Primary Examiner*—Mark L. Bell
*Attorney, Agent, or Firm*—Jordan B. Bierman

[57] ABSTRACT

A glass-aluminum nitride composite comprising a sintered body is produced by adding glass powder to aluminum nitride grains having an oxygen content of less than 2% and a mean grain diameter of 1.0 μm or more and subjecting the mixture to molding and sintering. A suitable glass is one based on borosilicate and the addition of an AlN whisker serves to improve the strength. The composite material of the present invention has a high heat conductivity, a low permittivity and a high strength and is suitable as a semiconductor packaging material.

5 Claims, No Drawings

GLASS-ALUMINUM NITRIDE COMPOSITE MATERIAL

BACKGROUND OF THE INVENTION

1. Field of the Invention

The present invention relates to a glass-aluminum nitride composite having a high heat conductivity, particularly a glass-aluminum nitride composite having properties suitable for a semiconductor packaging material.

2. Description of the Prior Art

An increase in the speed of electronics elements and an increase in the integration density have been rapidly advanced. This has led to a severer demand for an insulating substrate on which the elements are mounted and packaging material. A high heat conductivity for coping with an increase in the density of heat buildup, a low dielectric constant for coping with an increase in the speed, and a lowering in the conductor resistance are particularly required of the packaging material. Regarding the highly heat conducive material, development has been made on an AlN material in addition to BeO and SiC. On the other hand, the demand for a lowering in the dielectric constant and a lowering in the conductor resistance cannot be satisfied by the highly heat conductive material, and priority has been given to the development of a glass-ceramic composite material. In the glass-ceramic composite material, both the heat conductivity and the mechanical strengths are so low that no satisfactory properties are obtained. For this reason, in order to meet the demand, studies have been made on a composite material comprising glass and a highly heat conductive powder. For example, Japanese Patent Laid-Open No. 210043/1988 disclosed a composite comprising glass and aluminum nitride powder. This composite has a permittivity of 5 to 7 and a heat conductivity of 20 W/m.K. Further, in Japanese Patent Laid-Open Nos. 221162/1990 and 196073/1990, a further slight improvement in the heat conductivity could be attained by specifying the oxygen content in aluminum nitride.

The above-described conventional glass-aluminum nitride composite is still unsatisfactory not only in the improvement in the heat conductivity but also in the strength of the substrate, and the improvement achieved therewith is at the most that of the performance of the conventional low temperature fired substrate, so that this composite cannot satisfy a further advanced property requirement. In the present invention, the heat conductivity is further improved particularly in a glass composite having a low permittivity and a high heat conductivity and provides a material having a high strength besides the abovedescribed properties.

SUMMARY OF THE INVENTION

The present invention relates to a glass-aluminum nitride composite material comprising a sintered body produced by adding glass powder to aluminum nitride grains having an oxygen content of less than 2% and a mean grain diameter of 1.0 μm or more and subjecting the mixture to molding and sintering, the glass-aluminum nitride composite material having a heat conductivity of 30 W/m.K or more. The glass powder preferably comprises 30 to 60% of $SiO_2$, 10 to 30% of $Al_2O_3$, 10 to 30% of $B_2O_3$ and 30% or less of MO (wherein M represents Mg, Ca or Sr). The aluminum nitride content is 50% to 95%, based on the composite material. The addition of an AlN whisker thereto contributes to a further improvement in the strength.

DETAILED DESCRIPTION OF THE PREFERRED EMBODIMENTS

The AlN grain used in the present invention should have an oxygen content of less than 2%. When the oxygen content is 2% or more, the heat conductivity of the composite is so insufficient that effect attained by compositing AlN becomes small. The mean grain diameter should be 1.0 μm or more. When it is less than 1.0 μm, the lowering in the heat conductivity is significant due to the diffusion of an element from the matrix glass, so that it is necessary to use a raw material having an at least given grain diameter. The lower the oxygen content, the better the results. In particular, a good heat conductivity can be obtained when the oxygen content is 0.4% or less. When the grain diameter exceeds 10.0 μm, no surface accuracy after sintering can be ensured. Further, it is possible to incorporate an AlN whisker for the purpose of increasing the strength of the composite. For Example, it is useful to add an AlN whisker having a minor diameter of 0.3 μm and a length of about 5 μm in an amount of 5% by volume. The glass powder having the above-described composition constituting the glass matrix is the powder of a known borosilicate glass which is preferred from the viewpoint of sintering temperature, permittivity, etc. The composition is regulated in the above-described range to regulate the sintering temperature. Further,. use may be made of a paste having a low electric resistance, such as Ag, Au or Cu, and simultaneous firing can be conducted to from a conductive circuit. Further, it is also possible to regulate the permittivity.

EXAMPLE 1

Each of the AlN samples having properties specified in Table 1 and glass powder (having a composition consisting of 50% of $SiO_2$, 15% of $Al_2O_3$, 20% of $B_2O_3$ and 15% of CaO) were mixed with an organic binder, etc., in a ball mill according to the formulation specified in the Table to prepare a slurry. The slurry was molded into a tape and fired in a nitrogen stream at 900° C. The resultant glass-aluminum nitride composite had a high heat conductivity as given in Table 2. It was possible to provide internal wiring and lamination before the firing. Further, it was also possible to bake a paste of metal, such as Au, Ag or Cu, in the surface of the sintered body. These render the composite useful as an electrical wiring board.

TABLE 1

| | Properties of AlN | | |
|---|---|---|---|
| No. | oxygen content (%) | mean grain diameter (μm) | AlN content (wt. %) |
| 1 | 0.3 | 1.5 | 65 |
| 2 | 0.8 | 1.5 | 65 |
| 3 | 1.5 | 1.5 | 65 |
| 4* | 2.5 | 1.5 | 65 |
| 5* | 1.5 | 0.5 | 65 |
| 6 | 1.5 | 2.5 | 65 |
| 7 | 1.5 | 1.5 | 80 |
| 8 | 1.5 | 1.5 | 60 |
| 9* | 1.5 | 1.5 | 40 |
| 10 | 0.3 | 2.0 | 60 |
| 11 | 0.4 | 2.0 | 60 |
| 12 | 0.5 | 2.0 | 60 |
| 13 | 0.8 | 2.0 | 60 |
| 14 | 0.3 | 3.0 | 60 |
| 15 | 0.3 | 5.0 | 50 |

TABLE 1-continued

| No. | Properties of AlN | | AlN content (wt. %) |
|---|---|---|---|
| | oxygen content (%) | mean grain diameter (μm) | |
| 16* | — | — | 0 |
| 17* | | AlN sintered body | |

Note)
*comparative example

TABLE 2

| No. | Volume specific resistance Ω·cm | Heat conductivity W/m·K | Relative permittivity | Bending strength kg/mm$^2$ |
|---|---|---|---|---|
| 1 | >10$^{13}$ | 35 | 5.0 | 25 |
| 2 | " | 45 | " | " |
| 3 | " | 40 | " | " |
| 4* | " | 10 | " | " |
| 5* | " | 12 | " | 20 |
| 6 | " | 45 | " | 25 |
| 7 | " | 50 | 5.5 | " |
| 8 | " | 35 | 5.0 | " |
| 9* | " | 15 | 4.5 | 20 |
| 10 | " | 50 | 5.0 | 25 |
| 11 | " | " | " | " |
| 12 | " | 45 | " | " |
| 13 | " | 40 | " | " |
| 14 | " | 55 | " | " |
| 15 | " | 60 | " | " |
| 16* | " | 3 | 4.0 | 15 |
| 17* | " | 180 | 8.0 | 35 |

Note)
*comparative example

EXAMPLE 2

A sintered body was prepared in the same manner as that of sample No. 3 of the Example 1, except that 5% by weight, based on the total weight of the glass and the ceramic component, of an AlN whisker (major diameter: 10 μm, minor diameter: 0.4 μm, transparent) was further added to the slurry.

The resultant sintered body had a bending strength of 40 kg/mm$^2$, and no deterioration was observed in the volume specific resistance, heat conductivity and relative permittivity.

According to the present invention, it is possible to provide a material having a high heat conductivity, a low permittivity and a high strength. This material is suitable for use in a semiconductor packaging material.

What is claimed is:

1. A glass-aluminum nitride sintered body produced by adding glass powder to aluminum nitride grains to form a composite material, and molding and sintering said composite material, said glass powder comprising 30% to 60% of SiO$_2$, 10% to 30% of Al$_2$O$_3$, 10% to 30% of B$_2$O$_3$, and not more than 30% of MO, wherein M is selected from the group consisting of Mg, Ca, and Sr, said aluminum nitride grains having an oxygen content of less than 2% and a mean diameter of at lest 1.0 μm, said aluminum nitride comprising 50% to 95% of said composite material, all percentages being by weight, said composite material having a heat conductivity of at least 30 w/m K.

2. The composite of claim 1 wherein said aluminum nitride comprises 50% to 80% of said composite material.

3. The composite of claim 1 comprising 0 to 5% by volume of an aluminum nitride whisker.

4. The composite of claim 3 wherein said aluminum nitride has one oxygen content of not more than 0.4%.

5. The body of claim 1 wherein said means diameter is not more than 10 μm.

* * * * *